United States Patent
Weerasekera et al.

(10) Patent No.: US 11,018,080 B2
(45) Date of Patent: May 25, 2021

(54) SEMICONDUCTOR PACKAGE AND METHOD OF FORMING THE SAME

(71) Applicant: AGENCY FOR SCIENCE, TECHNOLOGY AND RESEARCH, Singapore (SG)

(72) Inventors: Roshan Weerasekera, Singapore (SG); Surya Bhattacharya, Singapore (SG); Ka Fai Chang, Singapore (SG); Vempati Srinivasa Rao, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 0 days.

(21) Appl. No.: 16/087,621

(22) PCT Filed: Mar. 17, 2017

(86) PCT No.: PCT/SG2017/050133
§ 371 (c)(1),
(2) Date: Sep. 21, 2018

(87) PCT Pub. No.: WO2017/164810
PCT Pub. Date: Sep. 28, 2017

(65) Prior Publication Data
US 2019/0043792 A1 Feb. 7, 2019

(30) Foreign Application Priority Data

Mar. 21, 2016 (SG) .............................. 10201602169T (51) Int. Cl.
*H01L 23/498* (2006.01)
*H01L 23/538* (2006.01)
(Continued)

(52) U.S. Cl.
CPC .... *H01L 23/49811* (2013.01); *H01L 21/4857* (2013.01); *H01L 23/3128* (2013.01);
(Continued)

(58) Field of Classification Search
CPC .......... H01L 23/49811; H01L 25/0652; H01L 23/5383; H01L 23/5384; H01L 23/5389
See application file for complete search history.

(56) References Cited

U.S. PATENT DOCUMENTS 8,064,224 B2 11/2011 Mahajan et al.
8,227,904 B2 7/2012 Braunisch et al.
(Continued)

OTHER PUBLICATIONS

Lee et al., Study of Interconnection Process for Fine Pitch Flip Chip, 2009 Electronic Components and Technology Conference, 720-723 (Year: 2009).*

(Continued)

*Primary Examiner* — Shih Tsun A Chou
(74) *Attorney, Agent, or Firm* — Womble Bond Dickinson (US) LLP (57) ABSTRACT

Various embodiments may provide a semiconductor package. The semiconductor package may include a routing layer including a plurality of first layer contact elements on a first side and a plurality of second layer contact elements on a second side opposite the first side, and a first semiconductor die including a plurality of first electrical die contact elements coupled to the plurality of first layer contact elements. The semiconductor package may further include a second semiconductor die including a plurality of second electrical die contact elements coupled to the plurality of second layer contact elements, and a mold structure covering the second semiconductor die. A first pitch between neighbouring first electrical die contact elements may be greater than a second pitch between neighbouring second electrical die contact elements.

6 Claims, 11 Drawing Sheets

(51) Int. Cl.
- *H01L 21/48* (2006.01)
- *H01L 23/31* (2006.01)
- *H01L 25/065* (2006.01)
- *H01L 25/00* (2006.01)
- *H01L 23/00* (2006.01)

(52) U.S. Cl.
CPC ...... *H01L 23/5383* (2013.01); *H01L 23/5384* (2013.01); *H01L 23/5389* (2013.01); *H01L 25/0652* (2013.01); *H01L 25/50* (2013.01); *H01L 24/16* (2013.01); *H01L 2224/16225* (2013.01); *H01L 2225/06517* (2013.01); *H01L 2924/15311* (2013.01)

(56) References Cited

U.S. PATENT DOCUMENTS

| | | | |
|---|---|---|---|
| 8,901,748 B2 | 12/2014 | Manusharow et al. | |
| 8,946,900 B2 | 2/2015 | Qian et al. | |
| 2006/0226527 A1* | 10/2006 | Hatano | H01L 23/5389 257/686 |
| 2011/0037169 A1 | 2/2011 | Pagaila | |
| 2011/0285005 A1 | 11/2011 | Lin et al. | |
| 2013/0175686 A1 | 7/2013 | Meyer et al. | |
| 2014/0110856 A1* | 4/2014 | Lin | H01L 24/19 257/774 |
| 2014/0185264 A1* | 7/2014 | Chen | H01L 25/0652 361/814 |
| 2014/0353823 A1 | 12/2014 | Park et al. | |
| 2015/0155256 A1 | 6/2015 | Lin et al. | |
| 2015/0206866 A1 | 7/2015 | Yu et al. | |
| 2015/0303174 A1 | 10/2015 | Yu et al. | |
| 2017/0062383 A1* | 3/2017 | Yee | H01L 21/565 |

OTHER PUBLICATIONS

Joe Macri, AMD's Next Generation GPU and High Bandwidth Memory Architecture: FURY, HOT CHIP Conference, Aug. 2015 (Year: 2015).*

Takayasu Sakurai, Closed-Form Expressions for Interconnection Delay, Coupling, and Crosstalk in VLSI's, IEEE Transactions on Electron Devices, vol. 40, No. I, Jan. 1993 (Year: 1993).*

PCT International Search Report for PCT Counterpart Application No. PCT/SG2017/050133, 4 pgs. (dated May 30, 2017).

PCT Written Opinion of the International Searching Authority for PCT Counterpart Application No. PCT/SG2017/050133, 5 pgs. (dated May 30, 2017).

PCT International Preliminary Report on Patentability for PCT Counterpart Application No. PCT/SG2017/050133, 28 pgs. (dated May 15, 2018).

Polka et al., "Package Technology to Address the Memory Bandwith Challenge for Tera-scale Computing," Intel Technology Journal, 2007, vol. 11, Issue 3, Intel Corporation, 197-205, 10 pages.

Shilov et al., "JEDEC Publishes HBM2 Specification as Samsung Begins Mass Production of Chips," http://anandtech.com/show/9969/jedec-publishes-hbm2-specification, Jan. 20, 2016, 8 pages.

* cited by examiner

- Form a routing layer — 202
- Couple a first semiconductor die to the plurality of first layer contact elements via a plurality of first electrical die contact elements — 204
- Couple a second semiconductor die to the plurality of second layer contact elements via a plurality of second electrical die contact elements — 206
- Cover the second semiconductor die with a mold structure — 208

| Connection type | Purpose |
|---|---|
| C1 (Die to PCB) | Power/GND supply, External Signals |
| C2 (Die to Die) | Die to Die High density signal connections through EFI |
| C3 (EFI to EFI) | in multi die systems, there might be multiple EFIs and if required they can be connected |
| C4 (EFI to Die) | EFI can be an active die and a connection to dies might be needed |
| C5 (EFI to PCB). | VDD/GND is required for devices in EFI or among interconnects for proper Signal and power integrity. |

SEMICONDUCTOR PACKAGE AND METHOD OF FORMING THE SAME

CROSS-REFERENCE TO RELATED APPLICATIONS

This patent application is a U.S. National Phase Application under 35 U.S.C. § 371 of International Application No. PCT/SG2017/050133, filed on 17 Mar. 2017, entitled SEMICONDUCTOR PACKAGE AND METHOD OF FORMING THE SAME, which claims the benefit of priority of Singapore application No. 10201602169T, filed on 21 Mar. 2016, the contents of which were incorporated by reference in the entirety for all purposes.

TECHNICAL FIELD

Various aspects of this disclosure relate to semiconductor packages and/or methods of forming semiconductor packages.

BACKGROUND

Portable computing systems have become one of the major drivers of the semiconductor industry. Such electronic systems include high performance logic (e.g. a central processing unit/graphics processing unit (CPU/GPU)) and one or more memory modules. Such systems are capable of carrying out massive amount of data processing. A huge amount of data may be transferred between the CPU/GPU and the one or more memory modules. Therefore, significant storage capacity in memories as well as higher data transfer capabilities (bandwidth) between logic and memory are required in order to meet the system demands.

In order to address this demand, high capacity memories have been introduced to the market. Further, both input/output (I/O) density and per I/O pin data-rates in new memory technologies have been increased using circuit techniques. In addition, new system architectural solutions such as 2.5 dimensions (2.5D) and three dimensions (3-D) integration have also been introduced to bring the memory close to the logic so that the data-rate could be further improved.

While the device IO pitch has gone down to 40 µm range, the packaging technology has not been improving at the same rate to support high IO count devices—the current organic package technology allows a pitch of the order of 150 µm. In order to address this gap between die and package IO mismatch, several interposer technologies and other package assemblies have been proposed. However, they are relatively expensive, less reliable and complicated to assemble or fabricate, in particular in known good die (KGD) testing and handling processes.

SUMMARY

Various embodiments may provide a semiconductor package. The semiconductor package may include a routing layer including a plurality of first layer contact elements on a first side and a plurality of second layer contact elements on a second side opposite the first side. The semiconductor package may also include a first semiconductor die including a plurality of first electrical die contact elements coupled to the plurality of first layer contact elements so that the first semiconductor die is in electrical connection with the plurality of first layer contact elements. The semiconductor package may further include a second semiconductor die including a plurality of second electrical die contact elements coupled to the plurality of second layer contact elements so that the second semiconductor die is in electrical connection with the plurality of second layer contact elements. The semiconductor package may additionally include a mold structure covering the second semiconductor die. The routing layer may be between the first semiconductor die and the second semiconductor die. At least one of the plurality of first layer contact elements may be in electrical connection with at least one of the plurality of second layer contact elements. A first pitch between neighbouring first electrical die contact elements may be greater than a second pitch between neighbouring second electrical die contact elements.

Various embodiments may provide a method of forming a semiconductor package. The method may include forming a routing layer including a plurality of first layer contact elements on a first side and a plurality of second layer contact elements on a second side opposite the first side. The method may also include coupling a first semiconductor die to the plurality of first layer contact elements via a plurality of first electrical die contact elements so that the first semiconductor die is in electrical connection with the plurality of first layer contact elements. The method may additionally include coupling a second semiconductor die to the plurality of second layer contact elements via a plurality of second electrical die contact elements so that the second semiconductor die is in electrical connection with the plurality of second layer contact elements. The method may further include covering the second semiconductor die with a mold structure. The routing layer may be between the first semiconductor die and the second second semiconductor die. At least one of the plurality of first layer contact elements may be in electrical connection with at least one of the plurality of second layer contact elements. A first pitch between neighbouring first electrical die contact elements may be greater than a second pitch between neighbouring second electrical die contact elements.

BRIEF DESCRIPTION OF THE DRAWINGS

The invention will be better understood with reference to the detailed description when considered in conjunction with the non-limiting examples and the accompanying drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or packages are analogously valid for the other methods or packages. Similarly, embodiments described in the context of a method are analogously valid for a package, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

The package as described herein may be operable in various orientations, and thus it should be understood that the terms "top", "bottom", etc., when used in the following description are used for convenience and to aid understanding of relative positions or directions, and not intended to limit the orientation of the package.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Figure 1:
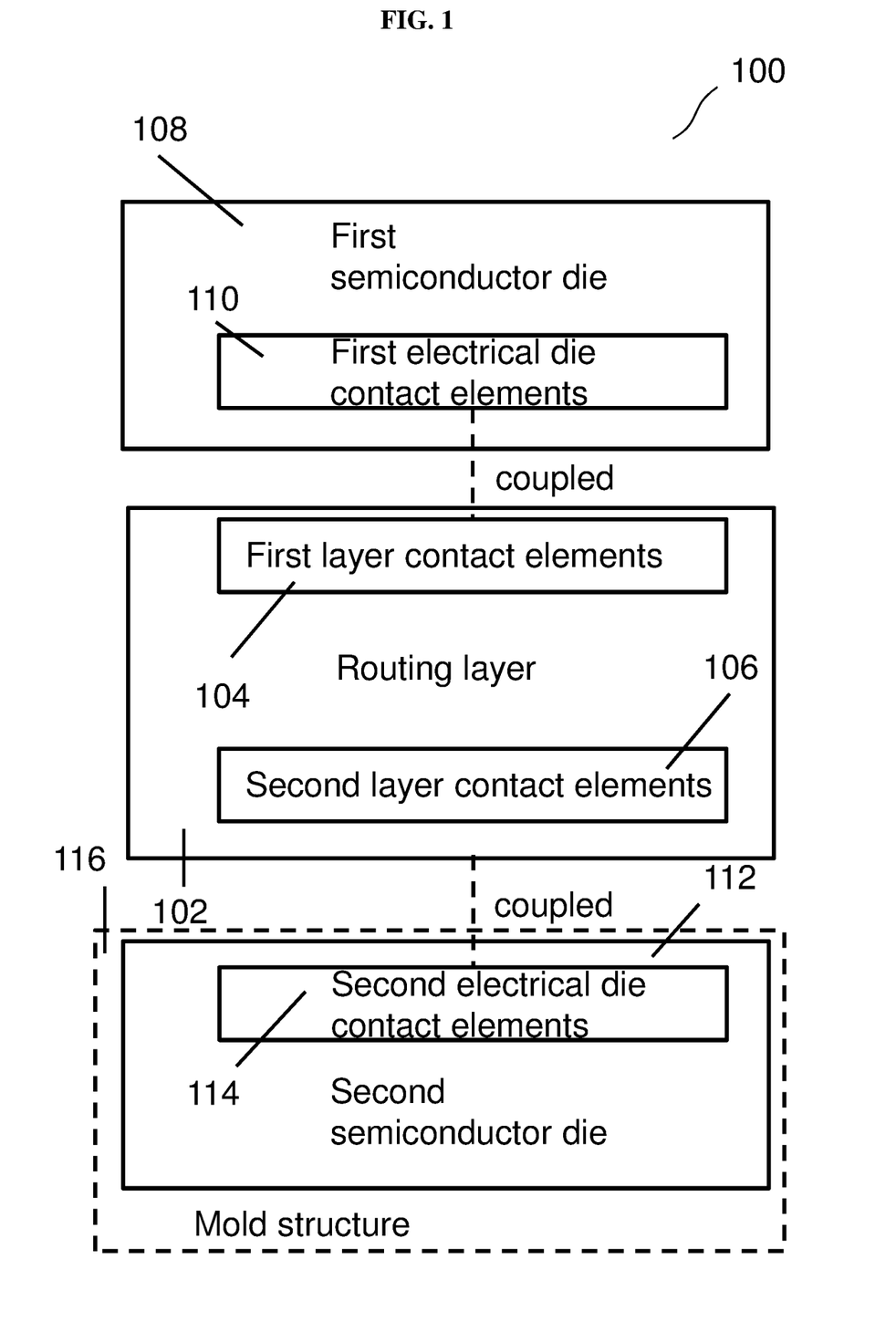
FIG. 1 is a general illustration of a semiconductor package according to various embodiments.

FIG. 1 is a general illustration of a semiconductor package 100 according to various embodiments. The semiconductor package 100 may include a routing layer 102 including a plurality of first layer contact elements 104 on a first side and a plurality of second layer contact elements 106 on a second side opposite the first side. The semiconductor package 100 may also include a first semiconductor die 108 including a plurality of first electrical die contact elements 110 coupled to the plurality of first layer contact elements 104 so that the first semiconductor die 108 is in electrical connection with the plurality of first layer contact elements 104. The semiconductor package 100 may further include a second semiconductor die 112 including a plurality of second electrical die contact elements 114 coupled to the plurality of second layer contact elements 106 so that the second semiconductor die 112 is in electrical connection with the plurality of second layer contact elements 106. The semiconductor package may additionally include a mold structure 116 covering the second semiconductor die 112. The routing layer 102 may be between the first semiconductor die 108 and the second semiconductor die 112. At least one of the plurality of first layer contact elements 104 may be in electrical connection with at least one of the plurality of second layer contact elements 106. A first pitch between neighbouring first electrical die contact elements 110 may be greater than a second pitch between neighbouring second electrical die contact elements 114.

In other words, the semiconductor package 100 may include a routing layer 102 which is able to electrically connect different semiconductor dice 108, 112 with contact elements 110, 114 of different pitch dimensions. The routing layer 102 may have a plurality of first layer contact elements 104, which are coupled to the first electrical die contact elements 110 of the first semiconductor die 108. The routing layer 102 may also have a plurality of second layer contact elements 106 which are coupled to the second electrical die contact elements 114. The pitch between a pair of neighbouring first electrical die contact elements 110 may be greater than the pitch between a pair of neighbouring second electrical die contact elements 114.

Various embodiments may seek to mitigate or address the various issues faced by conventional packages. Various embodiments may be less expensive, and/or be less complicated.

A first component "coupled" to a second component may refer to situations in which the first component is in contact with or mechanically attached to the second component, or situations in which the first component is electrically connected to and mechanically attached or physically connected to the second component via one or more further components, such as solder bumps or solder balls.

In various embodiments, the plurality of first electrical die contact elements 110 may be physically connected to the plurality of the first layer contact elements 104. In various embodiments, the plurality of second electrical die contact elements 114 may be physically connected to the plurality of the second layer contact elements 106.

In various embodiments, the plurality of first electrical die contact elements 110 may be coupled to the plurality of the first layer contact elements 104 via a plurality of first solder elements. In various embodiments, the plurality of second electrical die contact elements 114 may be coupled to the plurality of the second layer contact elements 106 via a plurality of second solder elements.

The routing layer 102 may be referred to as a redistribution layer.

The plurality of first layer contact elements 104 and the plurality of second layer contact elements 104 may refer to contact elements, such as contact pads, on opposing sides of the routing layer 102. In various embodiments, the first layer contact elements 104 may include or may be contact pads on the first side of the routing layer 102. The second layer contact elements 106 may include or may be contact pads on the second side of the routing layer 102.

The plurality of first electrical die contact elements 110 may include or may be contact elements, such as electrical interconnects or contact pads, of the first semiconductor die 108. The plurality of second electrical die contact elements 114 may include or may be contact elements, such as electrical interconnects or contact pads, of the second semiconductor die 112.

The second semiconductor die 112 may be an embedded fine-pitch interconnects (EFI) die, or may include or be an active device. The first semiconductor die 108 may be a normal die, e.g. a die with a pitch between neighbouring contact elements 110 greater than that of an EFI die.

In various embodiments, the plurality of first electrical die contact elements 110 may be aligned with the plurality of first layer contact elements 104. Each first layer contact element 104 may be spaced from a neighbouring first layer contact element 104 by the first pitch. The pitch between the pair of neighbouring first electrical die contact elements 110 may be substantially equal to the pitch between a pair of neighbouring first layer contact element 104.

In various embodiments, the plurality of second electrical die contact elements 114 may be aligned with the plurality of second layer contact elements 106. Each second layer contact element 106 may be spaced from a neighbouring second layer contact element 104 by the second pitch.

In various embodiments, a pitch between neighbouring second layer contact elements may be smaller than or may be substantially equal to a pitch between neighbouring first layer contact elements.

The routing layer 102 may include one or more dielectric layers; and one or more interconnection elements extending through the one or more dielectric layers so that at least one of the plurality of first layer contact elements 104 is in electrical connection with at least one of the plurality of second layer contact elements 105. At least one interconnection element may be or may include a conductive via structure.

The semiconductor package 100 may further include an external contact element on a first side of the mold structure 116 opposite a second side of the mold structure. The second side of the mold structure 116 may be in contact with the routing layer 102. In other words, the mold structure 116 may be between the routing layer 102 and the external contact element.

The mold structure 116 may include a vertical interconnect extending from the first side of the mold structure 116 to the second side of the mold structure 116 so that the routing layer 102 is in electrical connection with the external contact element. In various embodiments, the external contact element may be in direct electrical connection or in contact with the vertical interconnect. In various other embodiments, the semiconductor package 100 may further include a horizontal interconnect on the first side of the mold structure 116. The external contact element may be in electrical connection with the vertical interconnect via the horizontal interconnect.

The vertical interconnect may be electrically conductive and may be any selected from a group consisting of a through mold via (TMV), an electrically conductive pillar structure (e.g. a copper pillar structure), and an electrically conductive wire (e.g. a copper wire). The vertical interconnect may be referred to as a through wafer level packaging (WLP) interconnect.

The routing layer 102 may further include one or more interconnection elements in electrical connection with the vertical interconnect. The one or more interconnection elements may be in electrical connection with any selected from a group consisting of the first semiconductor die and the second semiconductor die. In other words, the external contact element and the vertical interconnect may be in electrical connection with the first semiconductor element 108 and/or or the second semiconductor element 112 via interconnection elements present in the routing layer 102.

In various embodiments, the semiconductor package 100 may further include a printed circuit board (PCB) in electrically connection with the external contact element. In various embodiments, the semiconductor package 100 may be mounted on a PCB using the external contact element.

The semiconductor package 100 may further include a further semiconductor die so that the routing layer 102 is between the further semiconductor die and the second semiconductor die. The further semiconductor die may be on the same side of the routing layer as the first semiconductor die 108. The further semiconductor die may be a normal die.

The further semiconductor die may be in electrical connection with the first semiconductor die 108. The routing layer 102 may include a first interconnection element configured to electrically connect the first semiconductor die 108 and the second semiconductor die 112. The routing layer 102 may further include a second interconnection element configured to electrically connect the second semiconductor die 112 and the further semiconductor die, so that the further semiconductor die is in electrical connection with the first semiconductor die 108 via the second semiconductor die 112.

The mold structure 116 may further include another semiconductor die. The second semiconductor die 112 may be in electrical connection with the other semiconductor die. The routing layer may include an interconnection element configured to electrically connect the second semiconductor die 112 and the other semiconductor die.

The second pitch may be smaller than the first pitch. In various embodiments, the second pitch may be any value from about 10 µm to about 50 µm. The first pitch may be any value above about 50 µm.

The semiconductor package 100 may further include a further mold structure covering the first semiconductor die 108.

Figure 2:
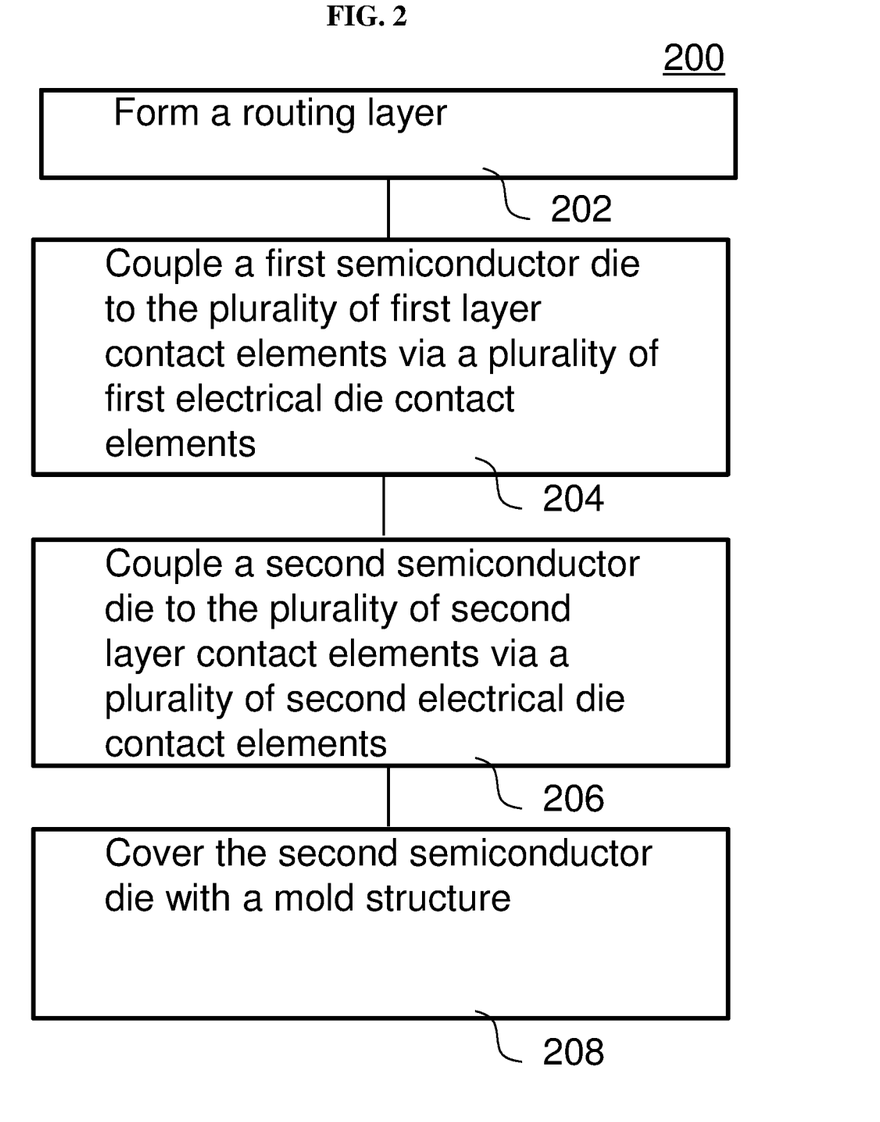
FIG. 2 is a schematic showing a method of forming a semiconductor package according to various embodiments.

FIG. 2 is a schematic 200 showing a method of forming a semiconductor package according to various embodiments. The method may include, in 202, forming a routing layer including a plurality of first layer contact elements on a first side and a plurality of second layer contact elements on a second side opposite the first side. The method may also include, in 204, coupling a first semiconductor die to the plurality of first layer contact elements via a plurality of first electrical die contact elements so that the first semiconductor die is in electrical connection with the plurality of first layer contact elements. The method may additionally include, in 206, coupling a second semiconductor die to the plurality of second layer contact elements via a plurality of second electrical die contact elements so that the second semiconductor die is in electrical connection with the plurality of second layer contact elements. The method may further include, in 208, covering the second semiconductor die with a mold structure. The routing layer may be between the first semiconductor die and the second second semiconductor die. At least one of the plurality of first layer contact elements may be in electrical connection with at least one of the plurality of second layer contact elements. A first pitch between neighbouring first electrical die contact elements may be greater than a second pitch between neighbouring second electrical die contact elements.

In other words, the method may include forming a semiconductor package as described herein. The method may include forming a routing layer and coupling the first semiconductor die and the second semiconductor die on opposing sides of the routing layer. The method may also include encapsulating the second semiconductor die.

The steps shown in FIG. 2 may not be in sequence. For instance, the first semiconductor die may be coupled to the plurality of first layer contact elements after coupling the second semiconductor die to the plurality of second layer contact elements, and covering the second semiconductor die with a mold structure.

In various embodiments, the second semiconductor die may be coupled to the second side of the routing layer before the first semiconductor die is coupled to the first side of the routing layer.

Covering the second semiconductor die with a mold structure may refer to encapsulating the second semiconductor die so that a surface or the entire second semiconductor die is in contact with the mold structure.

The method may also include providing a temporary substrate. The method may further include forming the routing layer on the temporary substrate.

The method may additionally include forming a vertical interconnect on the routing layer before providing the second semiconductor die on the second side of the routing layer and covering the second semiconductor die with the mold structure. In various other embodiments, the method may include forming a vertical interconnect on the routing layer after providing the second semiconductor die on the second side of the routing layer, but before covering the second semiconductor die with the mold structure.

The method may also include forming an external contact element on the mold structure after covering the second semiconductor die with the mold structure, so that the external contact element is in electrical connection with the vertical interconnect. In various embodiments, the external contact element may be in direct electrical connection with the vertical interconnect. In various other embodiments, the method may further include forming a horizontal interconnect on the mold structure so that the external contact element is in electrical connection with the vertical interconnect via the horizontal interconnect.

High-Bandwidth Memory (HBM) introduced recently to the market to achieve next generation portable computing systems solves two key problems related to contemporary dynamic random access memory (DRAM): it increases the bandwidth (BW) and reduces the power consumption. HBM (Gen1) contains 3982 micro-bumps with staggered pitches of 27.5 μm and 48 μm and sizes of 25 um. The die-to-die input-outputs (IOs) in HBM (~1200) may be located towards one side or edge so that the logic to memory channel length is reduced. However, in order to escape all these IOs and route them to CPU/GPU die, existing silicon interposer based packaging technologies may be used. However, such technologies are prohibitively expensive due to foundry based multi-layer fine-pitch interconnects and large interposer size.

Due to increasing performance demands in future computing platforms, the memory technology may go beyond HBM specifications and the die-to-die IOs may further increase in the future. Therefore, novel packaging technologies which reduce the system cost and footprint on par with the performance improvements are therefore required.

Various embodiments may provide an interposer technology using few thick metallization layers with an embedded fine pitch interconnect (EFI) die using wafer level assembly process.

Figure 3:
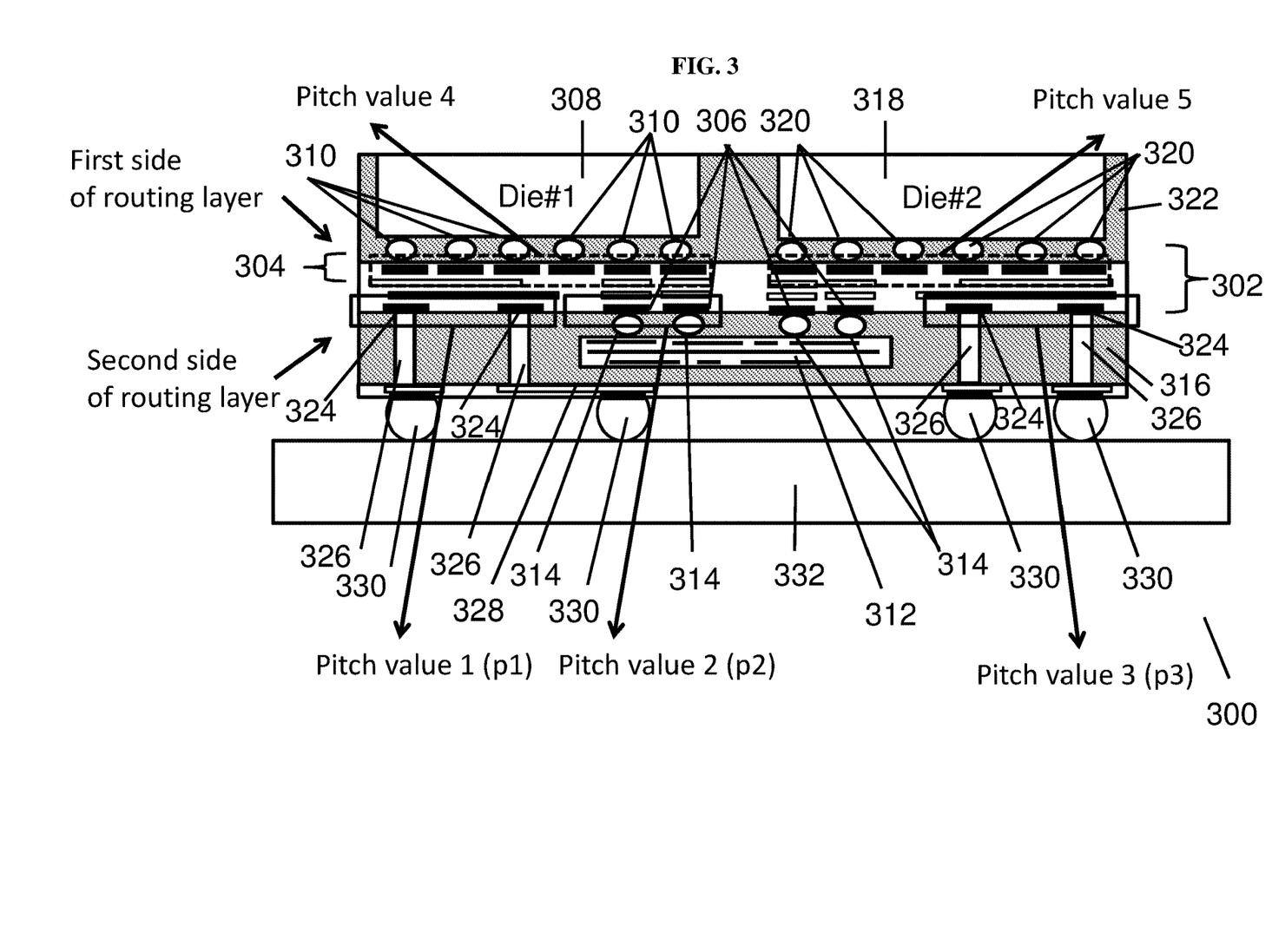
FIG. 3 is a schematic showing a cross-sectional side view of a semiconductor package according to various embodiments.

FIG. 3 is a schematic showing a cross-sectional side view of a semiconductor package 300 according to various embodiments. The semiconductor package 300 may include a routing layer 302 including a plurality of first layer contact elements 304 on a first side and a plurality of second layer contact elements 306 on a second side opposite the first side. In various embodiments, the routing layer 302 may include contacts elements 304, 306 with different or varying pitches on the first side and the second side of the routing layer 302.

The semiconductor package 100 may also include a first semiconductor die 308, i.e. Die #1, including a plurality of first electrical die contact elements 310 coupled to the plurality of first layer contact elements 304 so that the first semiconductor die 308 is in electrical connection with the plurality of first layer contact elements 304. The electrical die contact elements of a semiconductor die may refer to external die contact elements of the semiconductor die that is used for connecting the semiconductor die to another electrical component, such as the routing layer 302. The first semiconductor die 308 may be coupled or attached to the first side of the routing layer 302 via solder bumps or controlled collapse chip connection (C4).

The semiconductor package 300 may further include a second semiconductor die 312 including a plurality of second electrical die contact elements 314 coupled to the plurality of second layer contact elements 306 so that the second semiconductor die 312 is in electrical connection with the plurality of second layer contact elements 306. The semiconductor package 300 may additionally include a mold structure 316 covering the second semiconductor die 312. The routing layer 302 may be between the first semiconductor die 108 and the second semiconductor die 312. At least one of the plurality of first layer contact elements 304 may be in electrical connection with at least one of the plurality of second layer contact elements 306.

A first pitch between neighbouring first electrical die contact elements 310 may be greater than a second pitch between neighbouring second electrical die contact elements 314. The second semiconductor die 312 may include fine-pitch interconnects (EFI) and/or one or more active devices.

The second semiconductor die 312 may be coupled or attached to the second side of the routing layer 302 via solder bumps or controlled collapse chip connection (C4).

The semiconductor package 300 may include another semiconductor die 318, i.e. Die #2, including a plurality of electrical die contact elements 320 coupled to a further plurality of first layer contact elements 304 so that the other semiconductor die 318 is in electrical connection with the further plurality of first layer contact elements 304. The plurality of first layer contact elements 304 and the further plurality of first layer contact elements 304 may be on the same side of the routing layer 302, i.e. the first side of the routing layer 302. The other semiconductor die 318 may be coupled or attached to the first side of the routing layer 302 via solder bumps or controlled collapse chip connection (C4).

The first layer contact elements 304 and the second layer contact element 306 on opposite sides of the routing layer 302 may be contact pads. The routing layer 302 may include a plurality of metallization layers, which includes first layer contact elements 304 and the second layer contact element 306. The routing layer may further include one or more dielectric layers. The one or more dielectric layers may be between the plurality of metallization layers. The one or more dielectric layers may embed, cover or contact the plurality of metallization layers.

The semiconductor package 300 may further include a mold structure 322 covering the first semiconductor die 308 and the other semiconductor die 318. It may also be envisioned that the first semiconductor die 308 and the other semiconductor die 318 are not covered or in contact with a mold structure 322. The mold structure 316 and/or mold structure 322 may include a suitable mold compound. The mold structures 316, 322 may be configured to protect the respective semiconductor dice 308, 318, 312 covered by the mold structures 316, 322, i.e. environmental protection.

A pitch between neighbouring contact elements 304, 306 on the routing layer 302 may match with a corresponding pitch between neighbouring electrical die contact elements 310, 320, 314 of the semiconductor die. For instance, neighbouring contact elements 304 on the first side of the routing layer 302 directly facing corresponding neighbouring electrical die contact elements 310 may have a pitch substantially equal to a corresponding pitch between the corresponding neighbouring electrical die contact elements 310. Similarly, neighbouring contact elements 304 on the first side of the routing layer 302 directly facing corresponding neighbouring electrical die contact elements 320 may have a pitch substantially equal to a corresponding pitch between the corresponding neighbouring electrical die contact elements 320. Further, neighbouring contact elements 306 on the second side of the routing layer 302 directly facing corresponding neighbouring electrical die contact elements 314 may have a pitch substantially equal to a corresponding pitch between the corresponding neighbouring electrical die contact elements 314.

A pitch between the first layer contact elements 304 (e.g. having pitch value 4 or pitch value 5) may be greater than a pitch between the second layer contact elements 306 (e.g. having pitch value 2). Pitch value 4 may or may not be equal to pitch value 5.

Further, the routing layer 302 may include interconnection elements such as dedicated contact elements 324 that connect the routing layer 302 with other electrical elements (e.g. external contact elements 330) via vertical interconnects 326. The vertical interconnects 326 may provide die-to-package external interconnections. The mold structure 316 may include one or more vertical interconnect 326 extending from a first side of the mold structure 316 to a second side of the mold structure 324 opposite the first side of the mold structure 316. The routing layer 302 may include dedicated contact elements 324 on a second side of the routing layer 302 that connects to the vertical interconnects 326, which may be in electrical connection with the external contact elements 330. The external contact elements 330 may be solder bumps or controlled collapse chip connection (C4). One or more external contact elements 330 may be electrically connected to a vertical interconnect 326 by a horizontal interconnect element 328 on the exposed side of the mold structure 316. The external contact elements 330 may contact an external package or printed circuit board (PCB) 332.

A pitch between neighbouring dedicated contact elements 324 (e.g. having pitch value 1 or pitch value 3) may be greater than a pitch between the second layer contact elements 306 facing the die contact elements 314 (e.g. having pitch value 2). For instance, pitch value 2 may be less than 50 μm while pitch value 1 and/or pitch value 3 may have over 100 μm. Pitch value 1 may or may not be equal to pitch value 3.

Figure 4A:
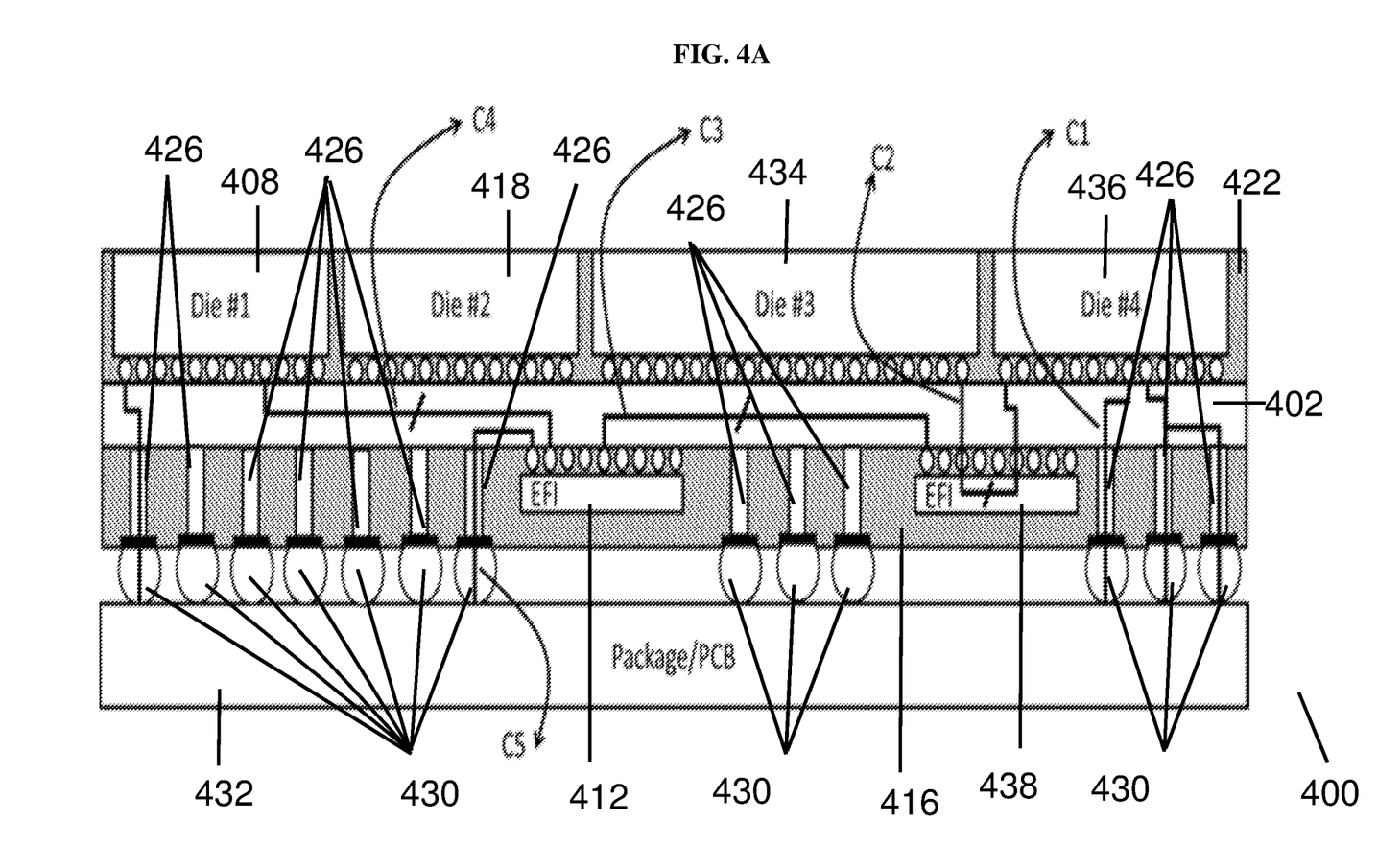
FIG. 4A is a schematic showing a cross-sectional side view of a semiconductor package according to various embodiments.

FIG. 4A is a schematic showing a cross-sectional side view of a semiconductor package 400 according to various embodiments. FIG. 4A shows some of the possible electrical connections in the semiconductor package 400. The contact elements in the semiconductor dice and routing layer have not been labelled to avoid clutter and improve clarity.

The package 400 may include a plurality of semiconductor dice 408, 418, 434, 436 (i.e. Dice #1, 2, 3 and 4) on a first side of the routing layer 402 and a plurality of semiconductor dice 412, 438 on a second side of the routing layer 402 opposite the first side. The semiconductor dice 408, 418, 434, 436 may be normal dice. The semiconductor dice 412, 438 may be EFI dice. The semiconductor dice 412, 438 may be covered by a mold structure 416, and the semiconductor dice 408, 418, 434, 436 may be covered by a further mold structure 422. The semiconductor dice 408, 418, 434, 436 and the semiconductor dice 412, 438 may or may not be of the same size.

The mold structure 416 may include a plurality of vertical interconnect structures 426 from a first side of the mold structure 416 (in contact with routing layer 402) to a second side of the mold structure 416 opposite the first side. Each vertical interconnect structure may be in contact with a respective external contact element 430. The plurality of external contact element 430 may be in contact with an external package or PCB 432.

Figure 4B:
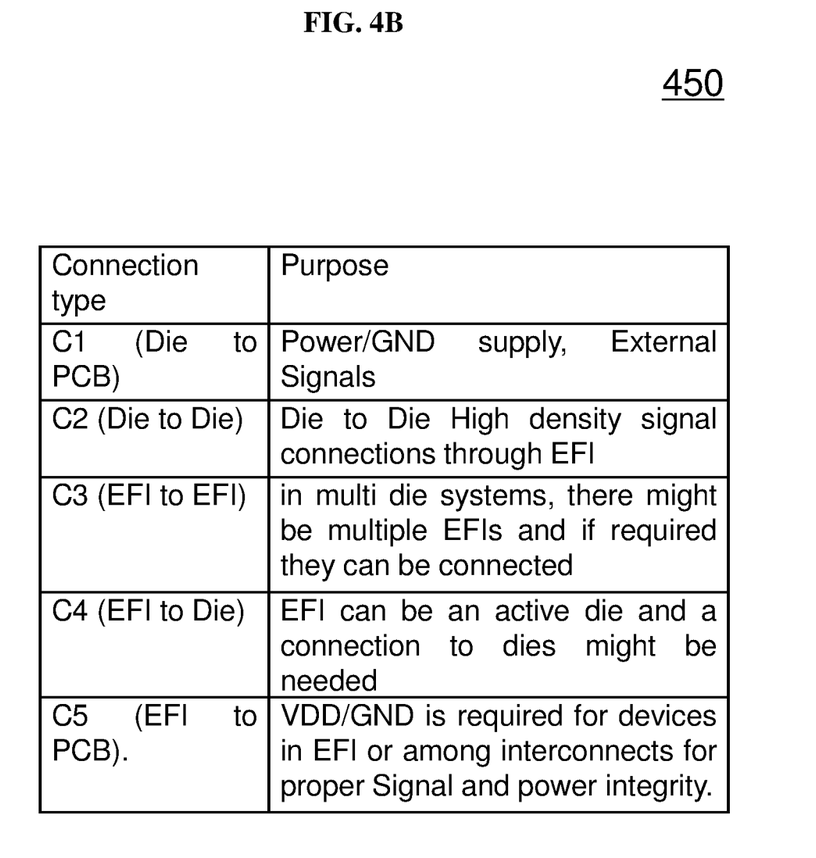
FIG. 4B shows a table showing the different types of connections illustrated in FIG. 4A.

FIG. 4B shows a table 450 showing the different types of connections illustrated in FIG. 4A. The normal semiconductor dice 408, 418, 434, 436 are referred to as "Die", while the EFI dice 412, 438 are referred to as "EFI" in table 450. The connection types may include Die to PCB (Connection 1 or C1), Die to Die (Connection 2 or C2), EFI to EFI (Connection 3 or C3), EFI to Die (Connection 4 or C4), and EFI to PCB (Connection 5 or C5).

C1 represents the electrical connection between a normal semiconductor die 436 and an external contact element 430, via the routing layer 402, and a vertical interconnect 430. C1 may also represent the electrical connection between any one of semiconductor dice 408, 418, 434 and an external contact element 430, via the routing layer 402, and a vertical interconnect 430. The routing layer 402 may include one or more interconnection elements connecting the normal semiconductor die and the vertical interconnect 430.

C2 represents the electrical connection between any two normal semiconductor dice 408, 418, 434, 436 via any one of EFI dice 412, 438. The routing layer 402 may include one or more first interconnection elements to electrically connect a first normal semiconductor die with an EFI die, and one or more second interconnection elements to electrically connect the EFI die with a second normal semiconductor die.

C3 represents the electrical connection between the two EFI dice 412, 438 via the routing layer 402. The routing layer 402 may include one or more interconnection elements electrically connecting the two EFI dice 412, 438.

C4 represents the electrical connection between any one of the normal semiconductor dice 408, 418, 434, 436 and any one of the EFI dice 412, 438 via the routing layer 402. The routing layer 402 may include one or more interconnection elements extending from a first side of the routing layer 402 to a second side of the routing layer 402 opposite the first side so that the first layer contact elements in contact with the normal semiconductor die and the second layer contact elements in contact with the EFI die are in electrical connection, so that the normal semiconductor die is electrically connected to the EFI die.

C5 represents the electrical connection between any one of the EFI dice 412, 438 and an external contact element 430 via the routing layer 402, and a vertical interconnect 430. The routing layer 402 may include one or more interconnection elements connecting the EFI die and the vertical interconnect 430.

Various embodiments may provide a greater flexibility on electrical routing and may provide many possible electrical connections which are of utmost importance in multi-die system design.

Figure 5A:
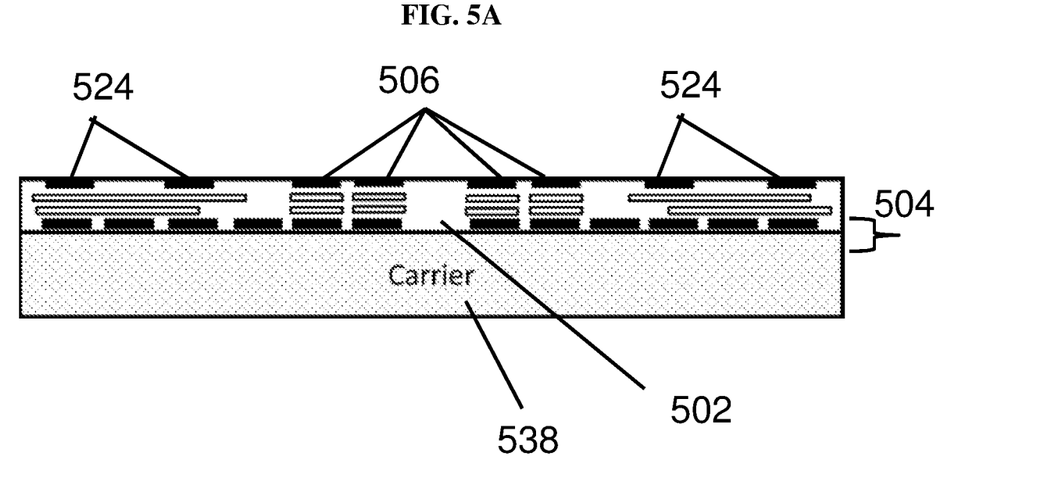
FIG. 5A shows forming a routing layer according to various embodiments.
Figure 5B:
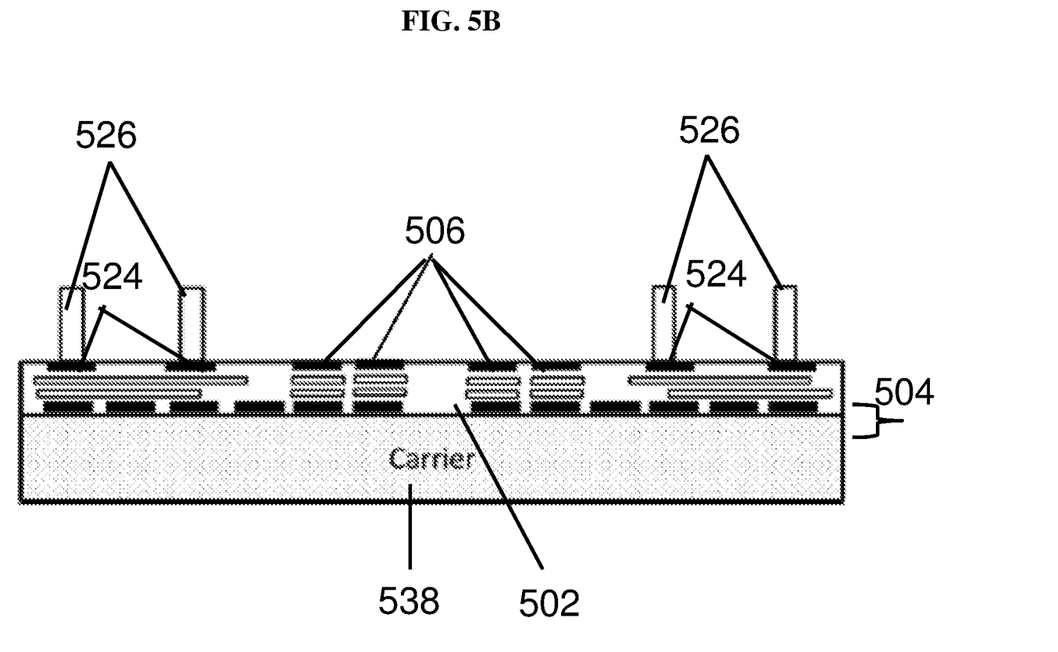
FIG. 5B shows forming vertical interconnects on the routing layer according to various embodiments.
Figure 5C:
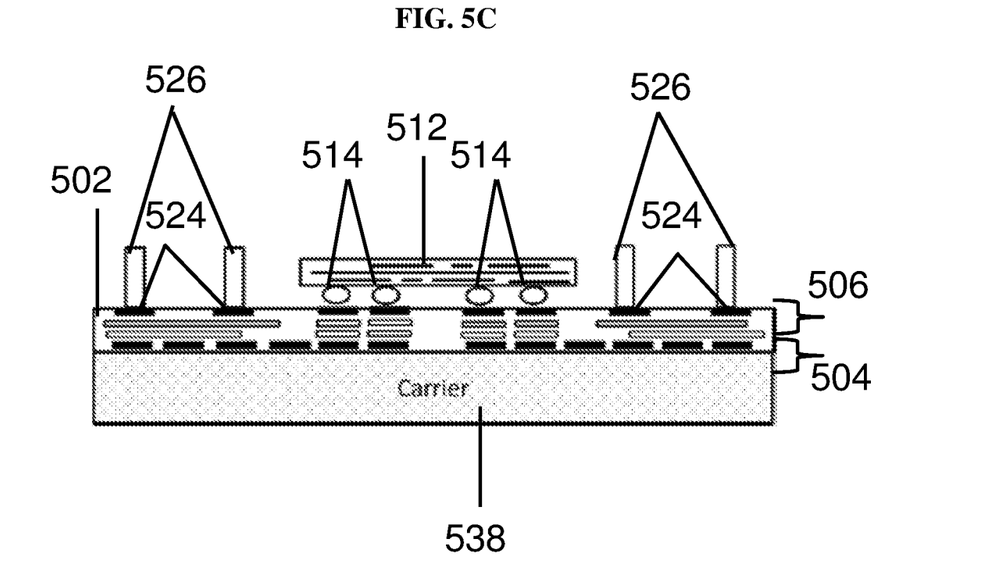
FIG. 5C shows coupling a semiconductor die to the plurality of second layer contact elements via a plurality of electrical die contact elements so that the semiconductor die is in electrical connection with the plurality of second layer contact elements according to various embodiments.
Figure 5D:
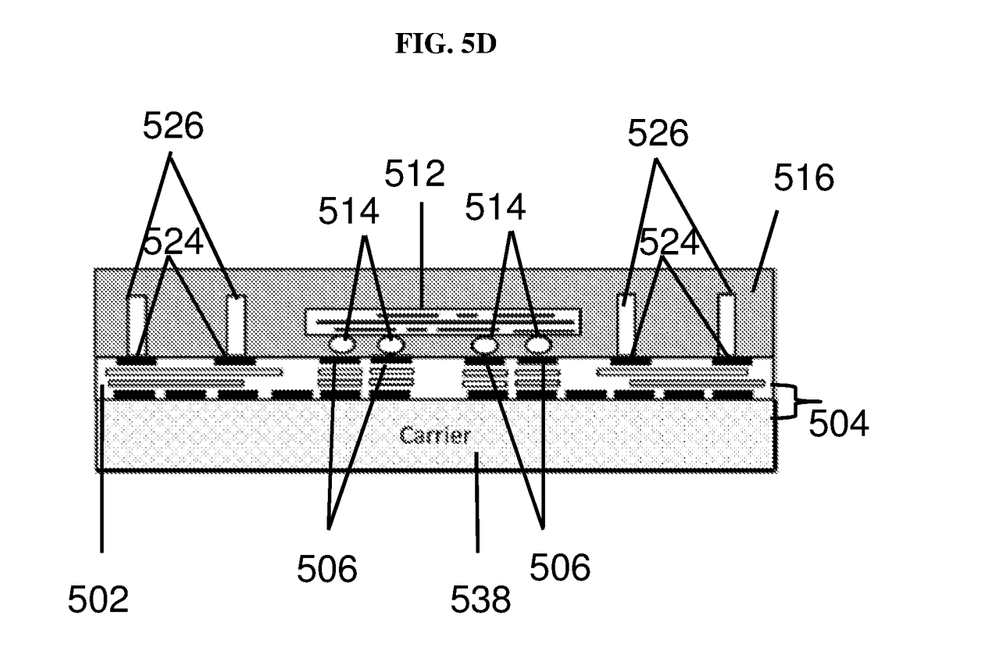
FIG. 5D shows covering the semiconductor die with a mold structure via a molding process according to various embodiments.
Figure 5E:
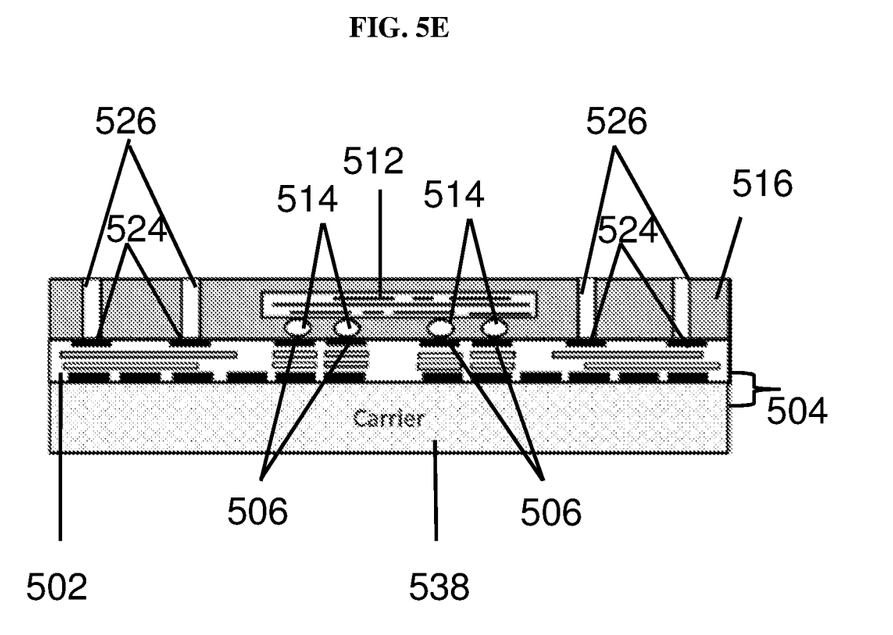
FIG. 5E shows a mold surface finish process according to various embodiments.
Figure 5F:
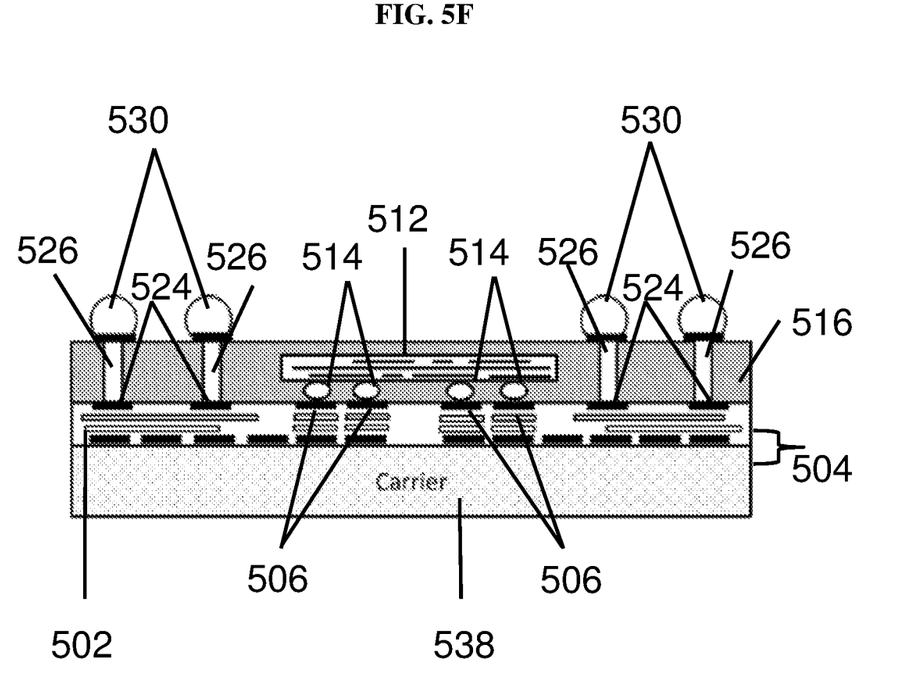
FIG. 5F shows forming of external contact elements on or over the mold structure.
Figure 5G:
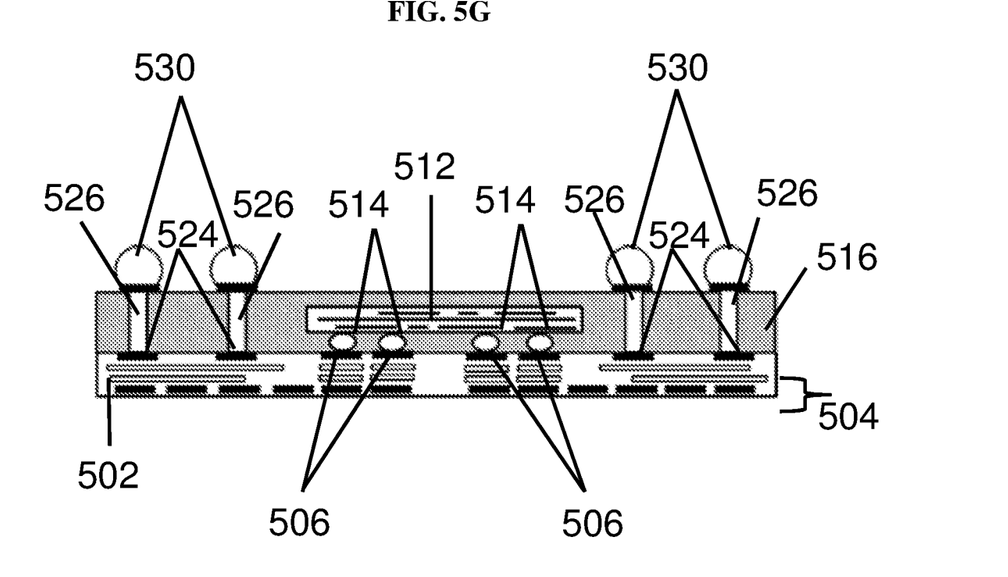
FIG. 5G shows the removal of carrier according to various embodiments.
Figure 5H:
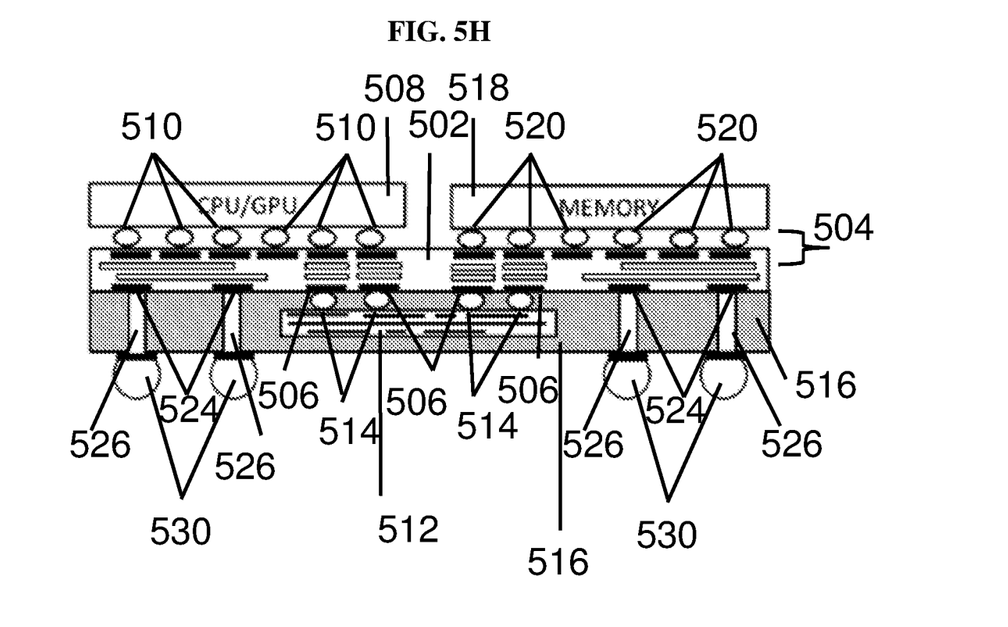
FIG. 5H shows coupling semiconductor dice to the plurality of first layer contact elements via a plurality of electrical die contact elements so that the semiconductor dice are in electrical connection with the plurality of first layer contact elements according to various embodiments.
Figure 5I:
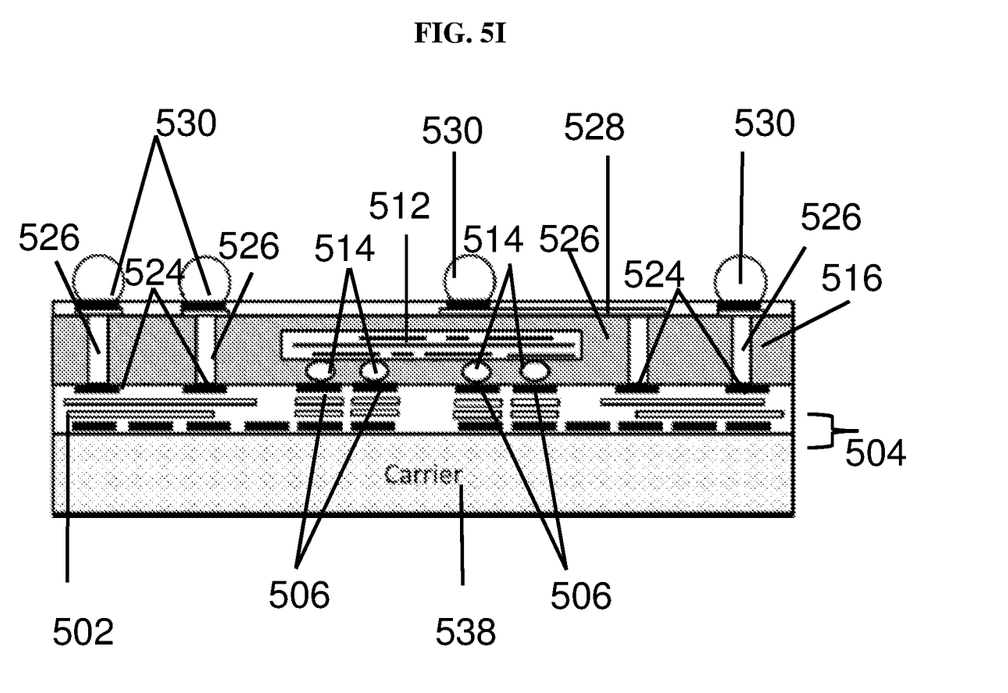
FIG. 5I shows forming of external contact elements on or over the mold structure similar to that shown in FIG. 5F, but also shows forming of one or more horizontal interconnects on or above the mold structure according to various alternate embodiments.
Figure 5J:
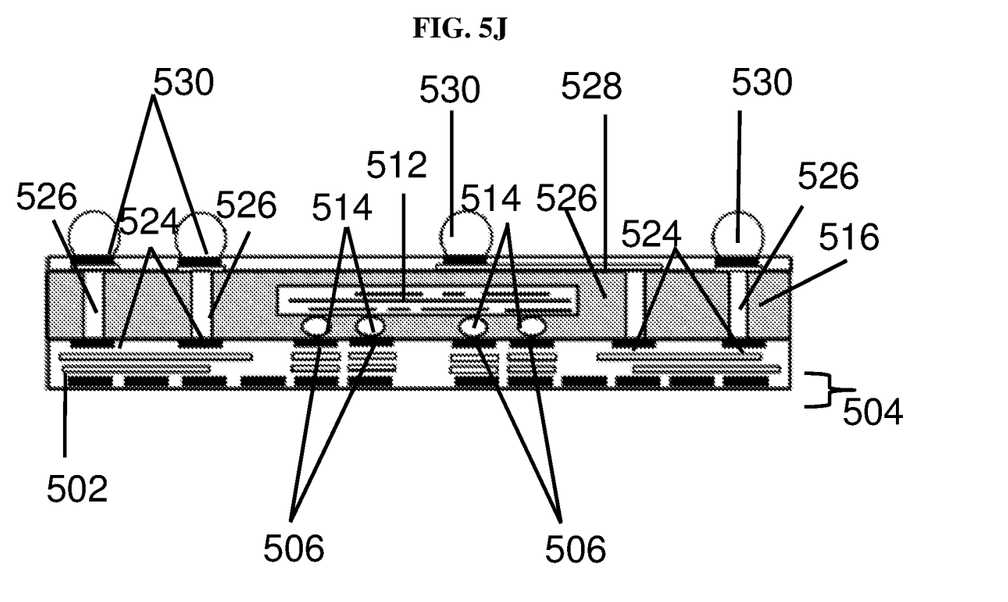
FIG. 5J shows the removal of carrier according to various alternate embodiments.
Figure 5K:
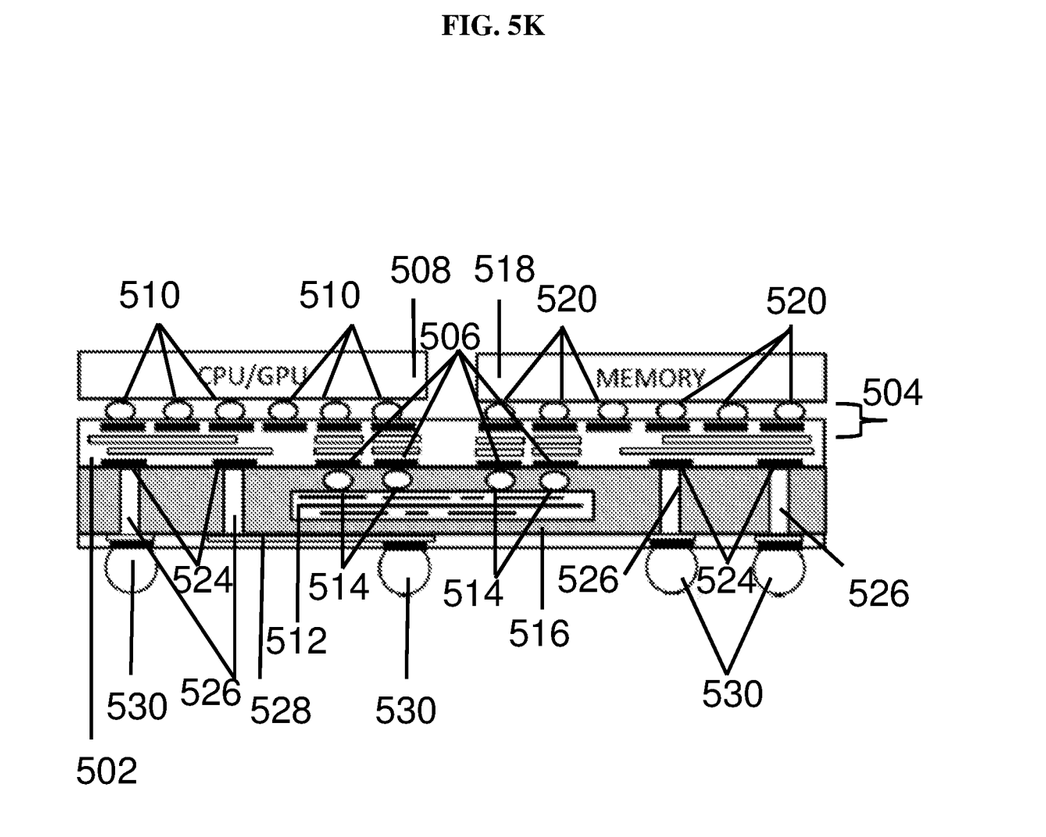
FIG. 5K shows coupling semiconductor dice to the plurality of first layer contact elements via a plurality of electrical die contact elements so that the semiconductor dice are in electrical connection with the plurality of first layer contact elements according to various alternate embodiments.

FIGS. 5A-K shows a method of forming a semiconductor package according to various embodiments. FIGS. 5A-E shows the method up to mold surface finishing, and FIGS. 5F-H show the processing steps after mold surface finishing according to various embodiments, while FIGS. 5I-K show the processing steps after mold surface finishing according to various alternate embodiments.

FIG. 5A shows forming a routing layer 502 according to various embodiments. The routing layer 502 may include a plurality of metallization including a plurality of first layer contact elements 504 on a first side of layer 502 and a plurality of second layer contact elements 506 and dedicated contact elements 524 on a second side opposite the first side. The routing layer 502 may be formed on or over a carrier 538, which may be a temporary wafer. The plurality of metallization layers may be covered or may be in contact by a plurality of dielectric layers.

The dedicated contact elements 524 may have a greater pitch compared to the second layer contact elements 506.

FIG. 5B shows forming vertical interconnects 526 on the routing layer 502 according to various embodiments. A vertical interconnect 526 may be formed in contact with a respective dedicated contact element 524.

FIG. 5C shows coupling a semiconductor die 512 to the plurality of second layer contact elements 506 via a plurality of electrical die contact elements 514 so that the semiconductor die 512 is in electrical connection with the plurality of second layer contact elements 506 according to various embodiments. The semiconductor die may be an EFI die. The semiconductor die 512 may be coupled to the plurality of second layer contact elements 506 using flip-chip attach. The plurality of second layer contact elements 506 may be electrically connected to the electrical die contact elements 514 using solder bumps.

FIG. 5D shows covering the semiconductor die 512 with a mold structure 516 via a molding process according to various embodiments.

FIG. 5E shows a mold surface finish process according to various embodiments. The mold structure 516 may be thinned, for instance using a backgrinding process, until the vertical interconnects 526, i.e. end portions of vertical interconnects 526, are exposed.

FIG. 5F shows forming of external contact elements 530 on or over the mold structure 516. The external contact elements 530 may be in contact with end portions of the vertical interconnects 526. The external elements 530 may include underbump metallization pads on the mold structure 516, and solder balls in contact with the underbump metallization pads.

FIG. 5G shows the removal of carrier 538 according to various embodiments. The molded structure including the routing layer 502, the semiconductor die 512, the mold structure 516, and external contact elements 530 may be separated from the carrier.

FIG. 5H shows coupling semiconductor dice 508, 518 to the plurality of first layer contact elements via a plurality of electrical die contact elements 510, 520 so that the semiconductor dice 508, 518 are in electrical connection with the plurality of first layer contact elements 504 according to various embodiments. The semiconductor dice 508, 518 may be coupled to the plurality of first layer contact elements 504 using flip chip bonding, or pick & place and reflow. The plurality of first layer contact elements 504 may be electrically connected to the electrical die contact elements 510, 520 using solder bumps. The semiconductor die 508 may be a CPU/GPU chip, and the semiconductor die 518 may be a memory chip.

FIGS. 5I-K shows the method according to various alternate embodiments after FIG. 5E. FIG. 5I shows forming of external contact elements 530 on or over the mold structure 516 similar to that shown in FIG. 5F, but also shows forming of one or more horizontal interconnects 528 on or above the mold structure 516 according to various alternate embodiments. A horizontal interconnect 528 may contact an external contact element at a first end and a vertical interconnect 526 at a second end opposite the first end.

FIG. 5J shows the removal of carrier 538 according to various alternate embodiments. The molded structure including the routing layer 502, the semiconductor die 512, the mold structure 516, the one or more horizontal interconnects 528, and external contact elements 530 may be separated from the carrier.

FIG. 5K shows coupling semiconductor dice 508, 518 to the plurality of first layer contact elements via a plurality of electrical die contact elements 510, 520 so that the semiconductor dice 508, 518 are in electrical connection with the plurality of first layer contact elements 504 according to various alternate embodiments.

As the routing layer or interposer 502 is implemented before the dice are attached, the routing layer interposer 502 may be tested for KGD.

Increasing bandwidth requirement of high-speed electronic systems has provided a challenge to existing electronic packaging technologies as they are unable to meet fine-pitch I/O requirements. Various embodiments may address this challenge. Various embodiments may provide a package for embedded fine-pitch interconnect dice. The package may include redistribution layers/metallization and through mold interconnects for external I/Os. Various embodiments may provide greater flexibility for signal and power I/O routing. Various embodiments may enable high-density inter-chip connections which are required for GPU, field programmable gate arrays (FPGAs) etc. with high-bandwidth memory.

Various embodiments may enable high interconnect densities for die-to-die interconnects while providing lower density RDLs and vertical interconnects for external routing. Various embodiments may provide cost benefits compared to TSV based silicon interposer technologies.

Various embodiments may also relate to methods of forming such semiconductor packages.

Advantages may include high through put die-to-die interconnections, detection capability, signal interconnections/power interconnections (SI/PI) improvement, and/or improved testability.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor package comprising:
a routing layer comprising one or more dielectric layers, a plurality of first layer contact elements and a further plurality of first layer contact elements on a first side of the routing layer, and a plurality of second layer contact elements on a second side of the routing layer opposite the first side;
a first semiconductor die comprising a plurality of first electrical die contact elements in physical contact with the plurality of first layer contact elements so that the first semiconductor die is in electrical connection with the plurality of first layer contact elements;
a second semiconductor die comprising a plurality of second electrical die contact elements in physical contact with the plurality of second layer contact elements so that the second semiconductor die is in electrical connection with the plurality of second layer contact elements; and
a mold structure covering the second semiconductor die;
a further semiconductor die comprising a plurality of further electrical die contact elements in physical contact with the further plurality of first layer contact elements so that the further semiconductor die is in electrical connection with the further plurality of first layer contact elements, and the routing layer is between the further semiconductor die and the second semiconductor die;
wherein the routing layer is between the first semiconductor die and the second semiconductor die;
wherein at least one of the plurality of first layer contact elements is in electrical connection with at least one of the plurality of second layer contact elements;
wherein a first pitch between neighbouring first electrical die contact elements is greater than a second pitch between neighbouring second electrical die contact elements;
wherein a further pitch between neighbouring further electrical die contact elements is greater than the second pitch between the neighbouring second electrical die contact elements;

wherein the routing layer comprises a first interconnection element extending from the first side of the routing layer to the second side of the routing layer, the first interconnection element physically connecting the plurality of first layer contact elements and the plurality of second layer contact elements to electrically connect the first semiconductor die and the second semiconductor die;
wherein the routing layer further comprises a second interconnection element extending from the first side of the routing layer to the second side of the routing layer, the second interconnection element physically connecting the plurality of second layer contact elements and the further plurality of first layer contact elements to electrically connect the second semiconductor die and the further semiconductor die, so that the further semiconductor die is in electrical connection with the first semiconductor die via the second semiconductor die;
wherein the mold structure comprises another semiconductor die on the second side of the routing layer and lateral to the second semiconductor die;
wherein the routing layer comprises a third interconnection element extending between the second semiconductor die and the other semiconductor die to electrically connect the second semiconductor die and the other semiconductor die;
wherein the semiconductor package comprises an external contact element on a first side of the mold structure opposite a second side of the mold structure, the second side of the mold structure in contact with the routing layer;
wherein the mold structure comprises a vertical interconnect extending from the first side of the mold structure to the second side of the mold structure so that the routing layer is in electrical connection with the external contact element;
wherein the routing layer further comprises one or more additional interconnection elements in electrical connection with the vertical interconnect; and
wherein the one or more additional interconnection elements are in electrical connection with any selected from a group consisting of the first semiconductor die and the second semiconductor die.

2. The semiconductor package according to claim 1, wherein each first layer contact element is spaced from a neighbouring first layer contact element by the first pitch; and
wherein each second layer contact element is spaced from a neighbouring second layer contact element by the second pitch.

3. The semiconductor package according to claim 1, further comprising:
a printed circuit board in electrical connection with the external contact element.

4. The semiconductor package according to claim 1, wherein the vertical interconnect is electrically conductive and is any selected from a group consisting of a through mold via, an electrically conductive pillar structure, and an electrically conductive wire.

5. The semiconductor package according to claim 1, wherein the second pitch is any value from about 10 µm to about 50 µm.

6. The semiconductor package according to claim 1, wherein the first pitch is any value above about 50 µm.

* * * * *